(12) United States Patent
He et al.

(10) Patent No.: US 12,340,837 B2
(45) Date of Patent: Jun. 24, 2025

(54) RECOGNITION SYSTEM AND SRAM CELL THEREOF

(71) Applicants: NCKU Research and Development Foundation, Tainan (TW); Himax Technologies Limited, Tainan (TW)

(72) Inventors: Wei-Li He, Tainan (TW); Soon-Jyh Chang, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 18/629,735

(22) Filed: Apr. 8, 2024

(65) Prior Publication Data

US 2024/0257864 A1    Aug. 1, 2024

Related U.S. Application Data

(62) Division of application No. 17/548,975, filed on Dec. 13, 2021, now Pat. No. 11,990,178.

(51) Int. Cl.
| | |
|---|---|
| *G11C 7/16* | (2006.01) |
| *G06N 3/063* | (2023.01) |
| *G11C 5/06* | (2006.01) |
| *G11C 11/4074* | (2006.01) |
| *G11C 11/4076* | (2006.01) |
| *G11C 11/408* | (2006.01) |

(Continued)

(52) U.S. Cl.
CPC .......... *G11C 11/4099* (2013.01); *G06N 3/063* (2013.01); *G11C 5/06* (2013.01); *G11C 7/16* (2013.01); *G11C 11/4074* (2013.01); *G11C 11/4076* (2013.01); *G11C 11/4085* (2013.01); *G11C 11/4094* (2013.01); *G11C 11/54* (2013.01)

(58) Field of Classification Search
CPC ......................................................... G11C 7/24
See application file for complete search history.

(56) References Cited

U.S. PATENT DOCUMENTS

| | | | | |
|---|---|---|---|---|
| 10,084,467 | B1 * | 9/2018 | Chang | H03M 1/38 |
| 10,276,578 | B2 * | 4/2019 | Chen | H10B 12/50 |

(Continued)

OTHER PUBLICATIONS

Jian-Wei Su et al., "A 28nm 384kb 6T-SRAM Computation-in-Memory Macro with 8b Precision for AI Edge Chips," 2021 IEEE International Solid-State Circuits Conference, Feb. 17, 2021.

(Continued)

*Primary Examiner* — Douglas King
(74) *Attorney, Agent, or Firm* — Donald E. Stout; Stout, Uxa & Buyan, LLP

(57) ABSTRACT

A static random-access memory (SRAM) cell includes a first inverter and a second inverter being cross-coupled; a first access transistor that accesses an output of the first inverter under control of a word line; a second access transistor that accesses an output of the second inverter under control of the word line; a first passage transistor that passes a common-mode voltage, controlled by the output of the first inverter; a second passage transistor that passes an input signal, controlled by the output of the second inverter; and a capacitor switchably coupled to receive the common-mode voltage and the input signal through the first passage transistor and the second passage transistor respectively.

8 Claims, 7 Drawing Sheets

(51) Int. Cl.
  *G11C 11/4094* (2006.01)
  *G11C 11/4099* (2006.01)
  *G11C 11/54* (2006.01)

(56) References Cited

U.S. PATENT DOCUMENTS

| | | | | |
|---|---|---|---|---|
| 10,979,065 | B1* | 4/2021 | Chang | H03M 1/66 |
| 11,024,358 | B1* | 6/2021 | Srivastava | G11C 7/1006 |
| 11,416,146 | B1* | 8/2022 | Chang | G06F 7/5443 |
| 11,714,749 | B2* | 8/2023 | Lee | G11C 7/1006 |
| | | | | 365/189.011 |
| 2003/0162394 | A1* | 8/2003 | Takemura | H01L 21/02318 |
| | | | | 438/689 |
| 2018/0075886 | A1* | 3/2018 | Ishizu | G11C 14/0054 |
| 2019/0043560 | A1* | 2/2019 | Sumbul | G11C 11/419 |
| 2019/0057036 | A1* | 2/2019 | Mathuriya | G06F 9/45508 |
| 2021/0158854 | A1* | 5/2021 | Sinangil | G11C 11/412 |
| 2021/0240442 | A1* | 8/2021 | Srivastava | G11C 11/412 |
| 2022/0236869 | A1* | 7/2022 | Chih | G11C 7/1006 |
| 2022/0276835 | A1* | 9/2022 | Yang | H03M 1/466 |
| 2022/0366948 | A1* | 11/2022 | Horng | G11C 7/1057 |

OTHER PUBLICATIONS

Zhiyu Chen et al., "MC2-RAM: An In-8T-SRAM Computing Macro Featuring Multi-Bit Charge-Domain Computing and ADC-Reduction Weight Encoding" 2021 IEEE/ACM International Symposium on Low Power Electronics and Design (ISLPED); Added to IEEE Xplore: Aug. 4, 2021.

* cited by examiner

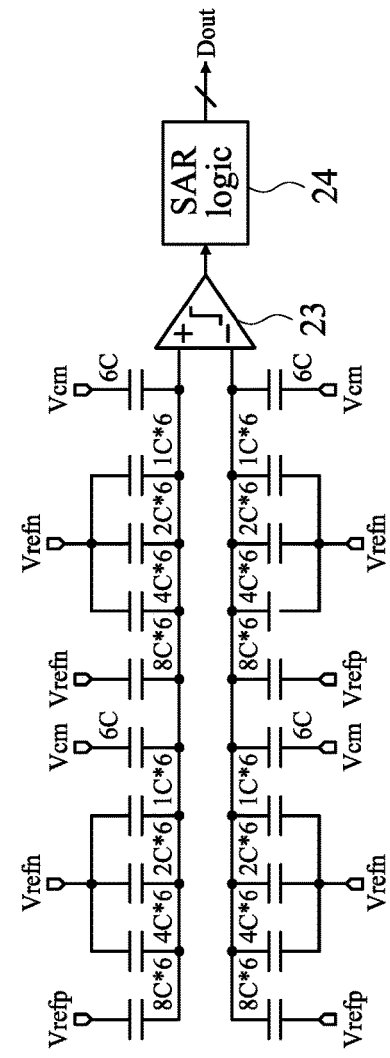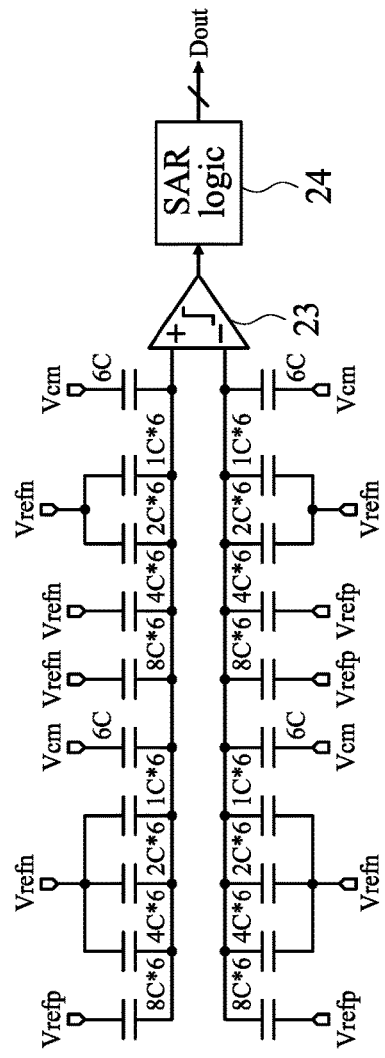
FIG. 4C
FIG. 4D

*FIG. 5B* Reset phase

*FIG. 5C* Output phase

RECOGNITION SYSTEM AND SRAM CELL THEREOF

CROSS-REFERENCE TO RELATED APPLICATIONS

This application is a divisional application of U.S. application Ser. No. 17/548,975, filed on Dec. 13, 2021, the entire contents of which are hereby incorporated by reference.

BACKGROUND OF THE INVENTION

1. Field of the Invention

The present invention generally relates to recognition, and more particularly to a recognition system adopting a neural network.

2. Description of Related Art

Voice activity detection (VAD) is a technology capable of detecting or recognizing presence or absence of human speech. VAD can be used to activate speech-based applications such as Apple Inc.'s virtual assistant Siri. VAD may be commonly adopted as a front-end device, which is generally an always-on and low-power system.

In the modern computer architecture proposed in 1945 by John von Neumann, the shared bus between the program memory and data memory leads to the von Neumann bottleneck. Because the single bus can only access either program memory or data memory but not both at a time, throughput is lower than the rate at which the CPU can work. This seriously limits the effective processing speed when the CPU is required to perform processing on large amounts of data. The CPU is continually forced to wait for needed data to move to or from memory.

Computation-in-memory (CIM) is a technique that integrates computation and memory. By embedding computation inside memory, it is feasible to make energy more efficient with less data transfer, and to save more bandwidth with massively parallel operations. CIM is beneficial to edge computing, a distributed computing paradigm that brings computation and data storage closer to the sources of data, with applications of machine learning for Internet of Things (IoT).

A need has thus arisen to propose a novel scheme for improving the performance for a system, as a voice recognition system, with low-power and/or high-bandwidth.

SUMMARY OF THE INVENTION

In view of the foregoing, it is an object of the embodiment of the present invention to provide a recognition system composed of SRAM cells adopting charge redistribution to generate an accumulated signal with reduced power consumption and/or enhanced bandwidth.

According to one embodiment, a recognition system includes a plurality of static random-access memory (SRAM) cells and a quantizer. The SRAM cells are arranged in columns, SRAM cells of each column respectively receive corresponding input signals and generate corresponding output signals that are then connected together to result in a sub-signal, and sub-signals of all the columns are subsequently connected together to result in an accumulated signal. The quantizer receives the accumulated signal and generates a digital output, the quantizer including at least one capacitor array, which is shared with the plurality of SRAM cells.

BRIEF DESCRIPTION OF THE DRAWINGS

FIG. 4C and FIG. 4D respectively show equivalent circuits of the SAR ADC in a first quantization phase and a second quantization phase when Vip (for the first DAC) is greater than Vin (for the second DAC);

FIG. 5B and FIG. 5C show equivalent circuits of the DAC in a reset phase and an output phase respectively.

DETAILED DESCRIPTION OF THE INVENTION

Figure 1A:
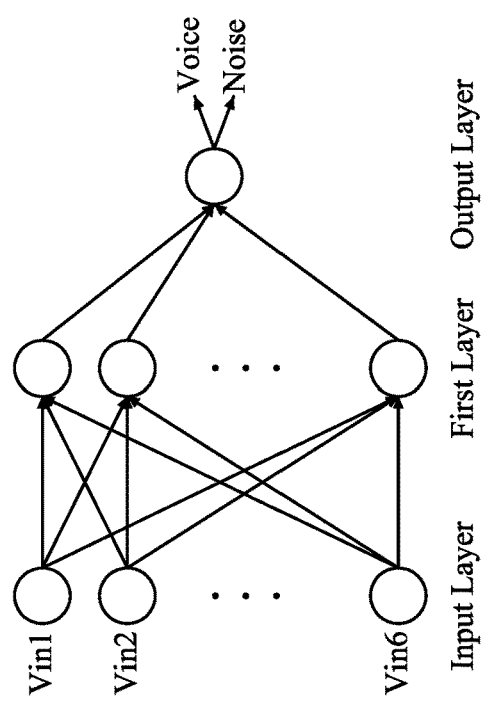
FIG. 1A shows a schematic diagram illustrating an (artificial) neural network adopted by a recognition system according to one embodiment of the present invention.

FIG. 1A shows a schematic diagram illustrating an (artificial) neural network adopted by a recognition system according to one embodiment of the present invention. The neural network may be composed of connected nodes (or neurons) with weights between the connected nodes, which may be trained via a dataset. The recognition system may, for example, be adaptable to voice recognition to recognize an input signal as either a voice or a noise. As exemplified in FIG. 1A, nodes of an input layer receive input signals (e.g., Vin1-Vin6) respectively representing extracted features of different channels, and a node of an output layer recognizes the input signals as either a voice or a noise. Nodes of one or more hidden layers, such as a first layer as shown, receive outputs of a preceding layer and accordingly generate outputs forwarding to a succeeding layer.

Figure 1B:
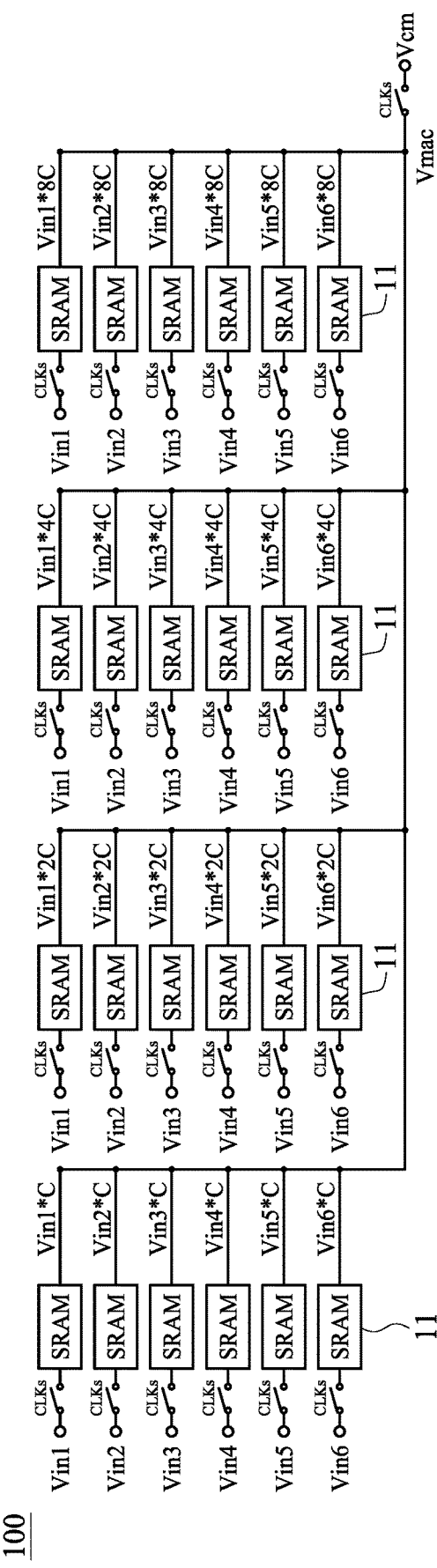
FIG. 1B shows a block diagram illustrating a recognition system according to one embodiment of the present invention.

FIG. 1B shows a block diagram illustrating a recognition system 100 according to one embodiment of the present invention. The recognition system 100 as exemplified in FIG. 1B may be adaptable to the input layer of FIG. 1A. According to one aspect of the embodiment, the recognition system 100 adopts a computation-in-memory technique that integrates computation and memory, thereby reducing power consumption and saving bandwidth.

Specifically, the recognition system 100 of the embodiment may include a plurality of static random-access memory (SRAM) cells 11 arranged in columns. For each column, SRAM cells 11 respectively receive corresponding input signals (e.g., Vin1-Vin6), and generate corresponding (weighted) output signals that are then connected (or added) together to result in a sub-signal. Sub-signals of all the columns (of the SRAM cells 11) are subsequently connected together to result in an accumulated signal Vmac, which represents an output signal (of the plurality of SRAM cells 11) by performing multiply-accumulate operation on the input signals.

Figure 2A:
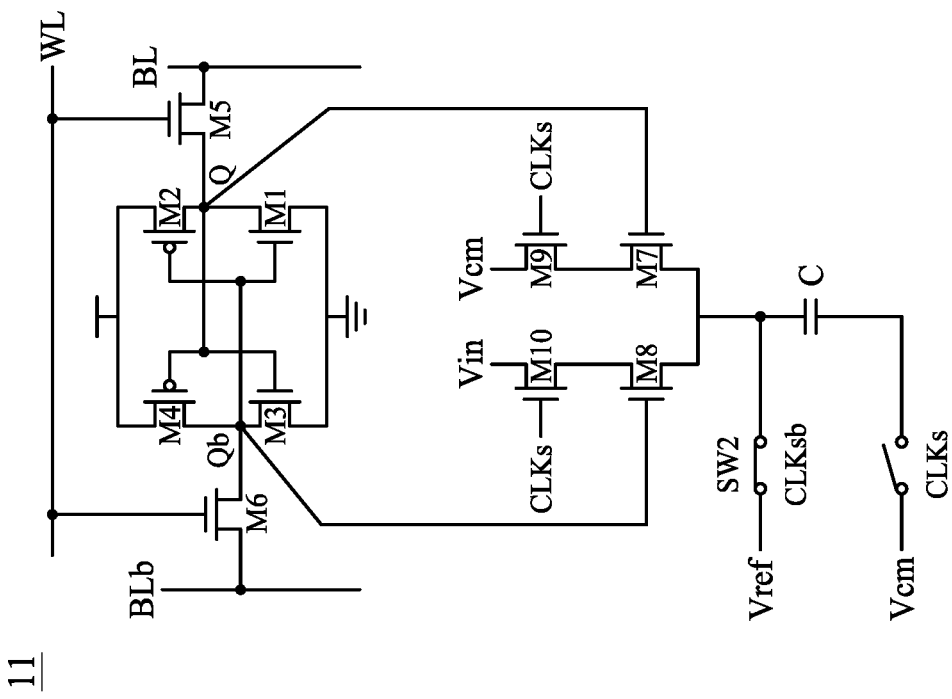
FIG. 2A shows a circuit diagram illustrating the SRAM cell of FIG. 1B according to one embodiment of the present invention.

FIG. 2A shows a circuit diagram illustrating the SRAM cell 11 of FIG. 1B according to one embodiment of the present invention. In the embodiment, the SRAM cell 11 may include eight transistors (e.g., metal-oxide-semiconductor field-effect transistors or MOSFETs) and one capacitor (i.e., 8T1C). Specifically, the SRAM cell 11 may include a first inverter composed of a first transistor M1 (e.g., N-type MOSFET) and a second transistor M2 (e.g., P-type MOSFET) with a type opposite the first transistor M1 connected in series between ground and a power; and a second inverter composed of a third transistor M3 (e.g., N-type MOSFET) and a fourth transistor M4 (e.g., P-type MOSFET) with a type opposite the third transistor M3 connected in series between the ground and the power. The first inverter (M1, M2) and the second inverter (M3, M4) are cross-coupled. That is, an output Q of the first inverter (M1, M2) is coupled to an input of the second inverter (M3, M4), and an (inverted) output Qb of the second inverter (M3, M4) is coupled to an input of the first inverter (M1, M2).

The SRAM cell 11 may include a first access transistor composed of a fifth transistor M5 (e.g., N-type MOSFET) configured to access the output Q of the first inverter (M1, M2) under control of a word line WL, and the output Q (of the first inverter) being then transferred via a first bit line BL; and a second access transistor composed of a sixth transistor M6 (e.g., N-type MOSFET) configured to access the (inverted) output Qb of the second inverter (M3, M4) under control of the word line WL, and the output Qb (of the second inverter) being then transferred via a second bit line BLb.

According to one aspect of the embodiment, the SRAM cell 11 may include a first passage transistor composed of a seventh transistor M7 (e.g., N-type MOSFET) configured to pass a common-mode voltage Vcm (via a drain), and (a gate) be controlled by the output Q of the first inverter (M1, M2); and a second passage transistor composed of an eighth transistor M8 (e.g., N-type MOSFET) configured to pass an input signal Vin (via a drain), and (a gate) be controlled by the output Qb of the second inverter (M3, M4). Outputs of the first passage transistor M7 and the second passage transistor M8 (at respective sources) are connected together.

According to another aspect of the embodiment, the SRAM cell 11 may include a capacitor C switchably coupled to receive the common-mode voltage Vcm and the input signal Vin through the first passage transistor M7 and the second passage transistor M8, respectively. In the embodiment, the capacitor C is switchably connected to the output of the first/second passage transistor M7/M8 via a switch SW1 controlled by a sample clock signal CLKs. It is noted that values of the capacitors C (i.e., weights) of different columns (of the recognition system 100) are different. Specifically, capacitors C of the plurality of SRAM cells 11 of different columns have binary-weighted values (for example, C, 2C, 4C and 8C), respectively.

Figure 2B:
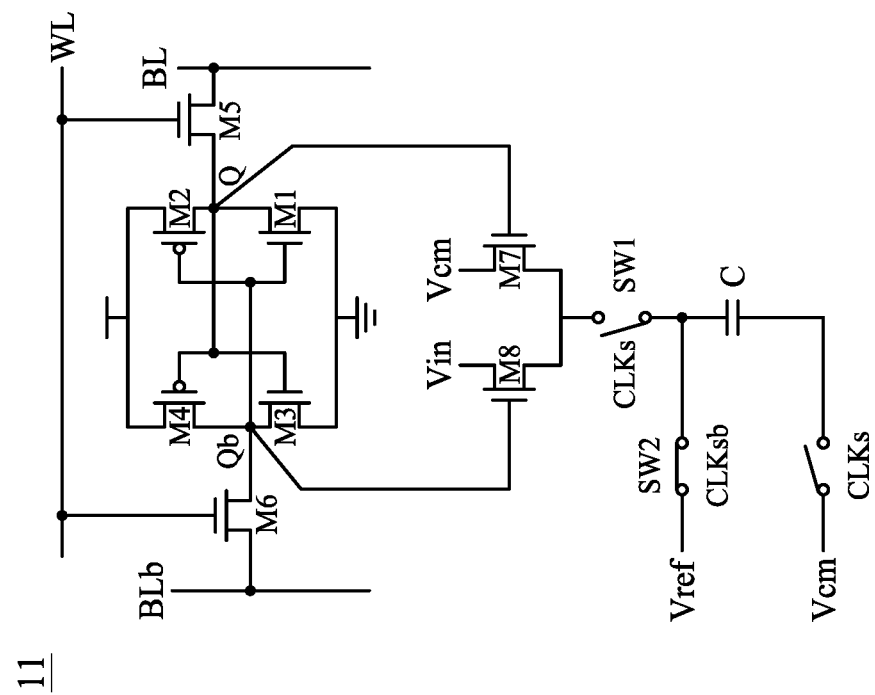
FIG. 2B shows a circuit diagram illustrating the SRAM cell of FIG. 1B according to another embodiment of the present invention.

FIG. 2B shows a circuit diagram illustrating the SRAM cell 11 of FIG. 1B according to another embodiment of the present invention. In the embodiment, the SRAM cell 11 may include ten transistors and one capacitor (i.e., 10T1C). The SRAM cell 11 of FIG. 2B is similar to that of FIG. 2A with the following exceptions. As shown in FIG. 2B, the SRAM cell 11 may further include a first switch transistor composed of a ninth transistor M9 (e.g., N-type MOSFET) connected in series with the first passage transistor M7; and a second switch transistor composed of a tenth transistor M10 (e.g., N-type MOSFET) connected in series with the second passage transistor M8. Accordingly, the first passage transistor M7 indirectly receives the common-mode voltage Vcm via the first switch transistor M9, which is (with a gate) controlled by the sample clock signal CLKs; and the second passage transistor M8 indirectly receives the input signal Vin via the second switch transistor M10, which is (with a gate) controlled by the sample clock signal CLKs. Nevertheless, the capacitor C is directly connected to the output of the first/second passage transistor M7/M8 without the switch SW1. Therefore, the first switch transistor M9 and the second switch transistor M10 collectively act as a switch, through which the capacitor C may switchably be coupled to receive the common-mode voltage Vcm and the input signal Vin from the first passage transistor M7 and the second passage transistor M8.

In operation, the switch SW1 (or the first/second switch transistor M9/M10) is closed in a sampling phase, during which (a bottom plate of) the capacitor C is sampling an analog voltage (at the output of the first/second passage transistor M7/M8), while a top plate of the capacitor C is coupled to the common-mode voltage Vcm. The switch SW1 (or the first/second switch transistor M9/M10) is open in a quantization phase, during which the bottom plate of the capacitor C is switchably coupled to a reference voltage Vref (e.g., positive reference voltage Vrefp or negative reference voltage Vrefn) via an inverted switch SW2, controlled by an inverted sample clock signal CLKsb (of inverted polarity with respect to the sample clock signal CLKs), while the sampled voltage is squeezed to a top plate of the capacitor C.

Figure 3A:
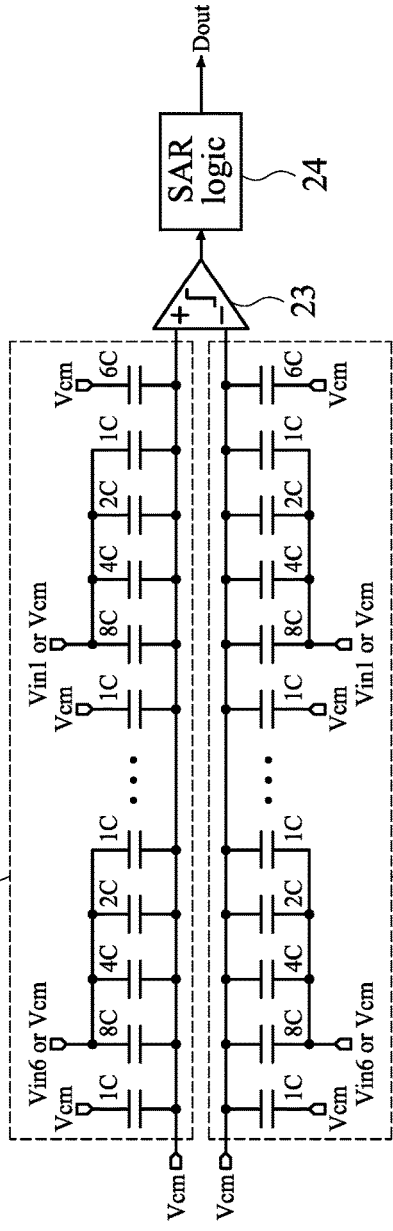
FIG. 3A shows a circuit diagram illustrating a successive-approximation-register (SAR) analog-to-digital converter (ADC), acting as a quantizer and being included in the recognition system according to one embodiment of the present invention.

FIG. 3A shows a circuit diagram illustrating a successive-approximation-register (SAR) analog-to-digital converter (ADC) 200A, acting as a quantizer and being included in the recognition system 100 according to one embodiment of the present invention. The SAR ADC 200A converts a continuous analog waveform into a discrete digital representation using a binary search through all possible quantization levels before finally converging upon a digital output Dout for each conversion. The SAR ADC 200A, acting as the quantizer, may be operatively utilized in companion with the SRAM cells 11 of FIG. 1B. Specifically, the SAR ADC 200A may include a first digital-to-analog converter (DAC) 21 composed of a capacitor array, and a second DAC 22 composed of a capacitor array. The capacitor arrays of the first DAC 21 and the second DAC 22 may be switchably coupled to the input signals (e.g., Vin1-Vin6) and the common-mode voltage Vcm. The SAR ADC 200A may include a comparator 23 coupled to receive an output of the first DAC 21 (at a non-inverting input node), and to receive an output of the second DAC 22 (at an inverting input node). Further, the comparator 23 may also receive the accumulated signal Vmac. The SAR ADC 200A may include a SAR logic 24 coupled to receive a comparison output of the comparator 23 and accordingly to generate the digital output Dout. According to one aspect of the embodiment, the capacitor arrays of the first DAC 21 and the second DAC 22 may be shared with the SRAM cells 11 of FIG. 1B.

Figure 3B:
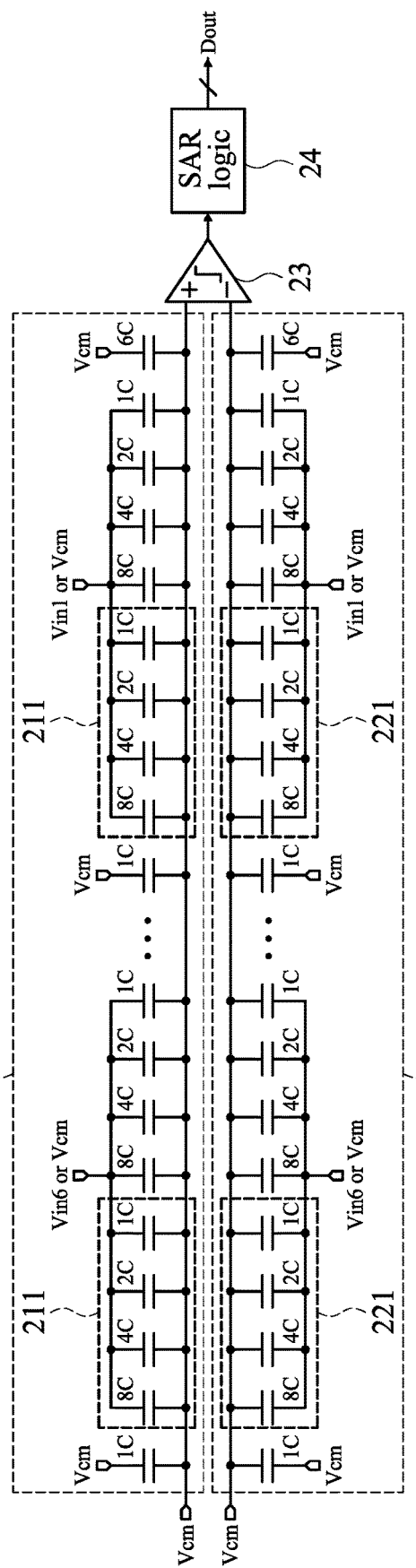
FIG. 3B shows a circuit diagram illustrating a SAR ADC, acting as a quantizer and being included in the recognition system according to another embodiment of the present invention.

FIG. 3B shows a circuit diagram illustrating a SAR ADC 200B, acting as a quantizer and being included in the recognition system 100 according to another embodiment of the present invention. The SAR ADC 200B (FIG. 3B) is similar to the SAR ADC 200A (FIG. 3A) with the following exceptions. In the embodiment, the first DAC 21 and the second DAC 22 may further respectively include first dummy (or replicated) capacitors 211 and second dummy (or replicated) capacitors 221, which are switchably connected to the input signals (e.g., Vin1-Vin6) and the common-mode voltage Vcm.

Figure 4A:
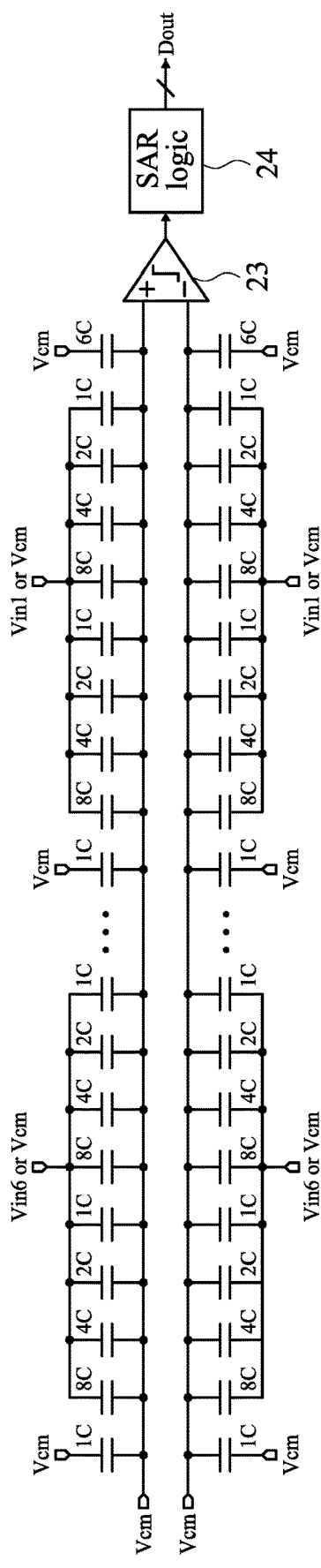
FIG. 4A shows an equivalent circuit of the SAR ADC in a first sample phase.
Figure 4B:
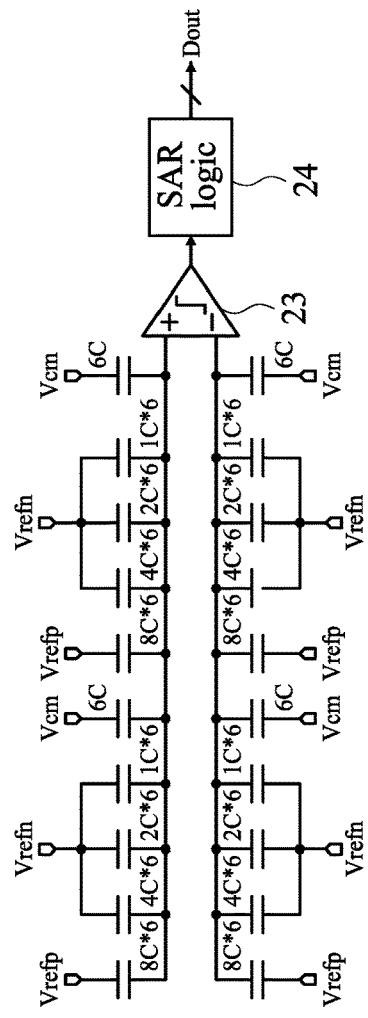
FIG. 4B shows an equivalent circuit of the SAR ADC in a second sample phase.
Figure 4E:
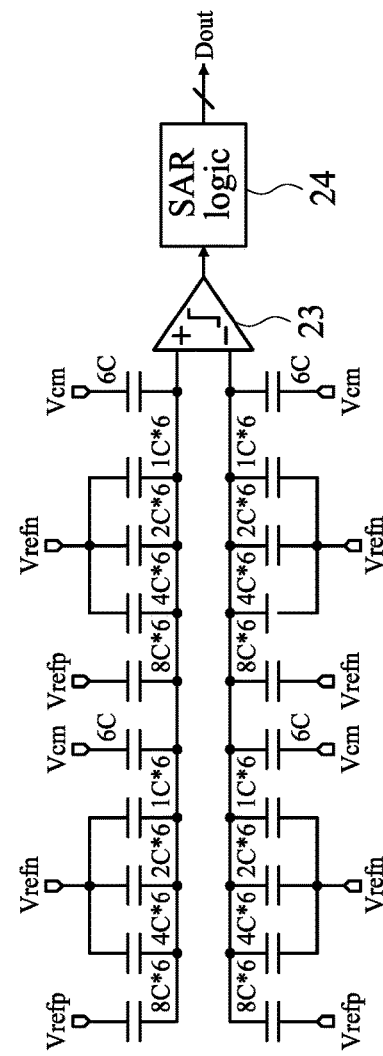
FIG. 4E and FIG. 4F respectively show equivalent circuits of the SAR ADC in the first quantization phase and the second quantization phase when Vip (for the first DAC) is less than Vin (for the second DAC)
Figure 4F:
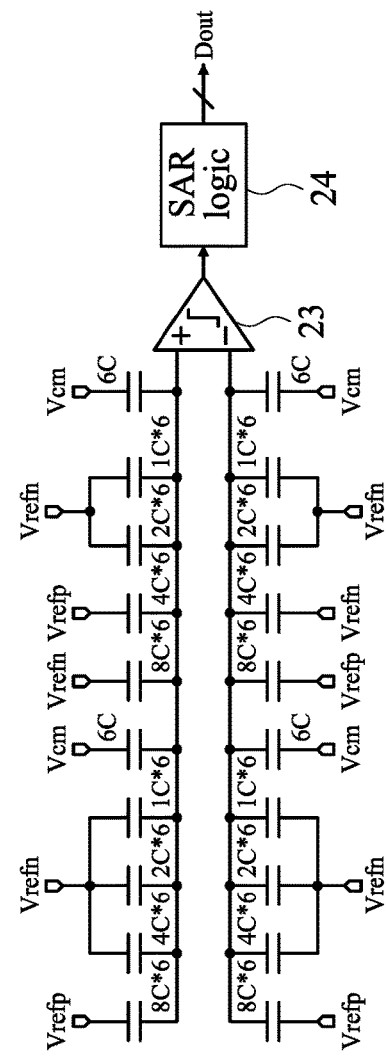

FIG. 4A shows an equivalent circuit of the SAR ADC 200B in a first sample phase, and FIG. 4B shows an equivalent circuit of the SAR ADC 200B in a second sample phase. FIG. 4C and FIG. 4D respectively show equivalent circuits of the SAR ADC 200B in a first quantization phase and a second quantization phase when Vip (for the first DAC 21) is greater than Vin (for the second DAC 22). FIG. 4E and FIG. 4F respectively show equivalent circuits of the SAR ADC 200B in the first quantization phase and the second quantization phase when Vip (for the first DAC 21) is less than Vin (for the second DAC 22).

According to the embodiments as disclosed above, the SRAM cells 11 of the embodiment adopt charge redistribution, instead of charge sharing as in the conventional systems, to generate the accumulated signal Vmac. Therefore, compared with the conventional systems, timing in the embodiments becomes simple without the need for reset phase. Further, the capacitor arrays of the SAR ADC 200A/B may be used in the sampling phase to generate the accumulated signal Vmac. Moreover, signal swing can preferably reach full range by adopting dummy capacitors in the SAR ADC 200B of FIG. 3B.

Figure 5A:
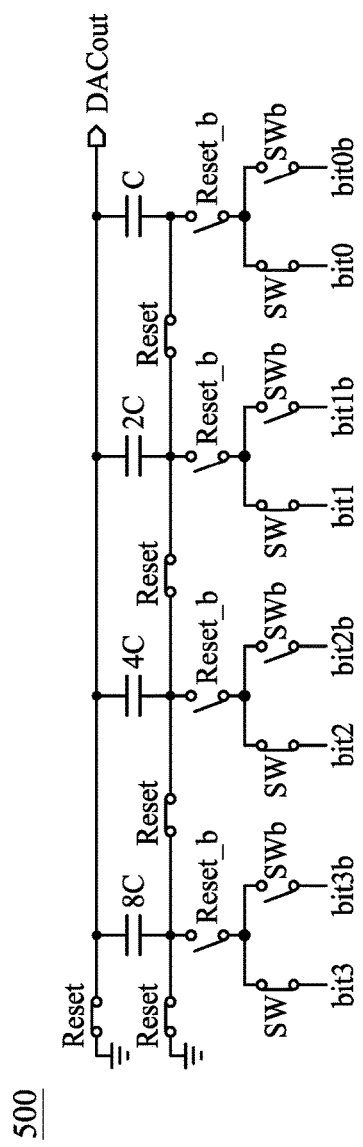
FIG. 5A shows a circuit diagram of a DAC illustrating a node in the first layer of FIG. 1A.
Figure 5D:
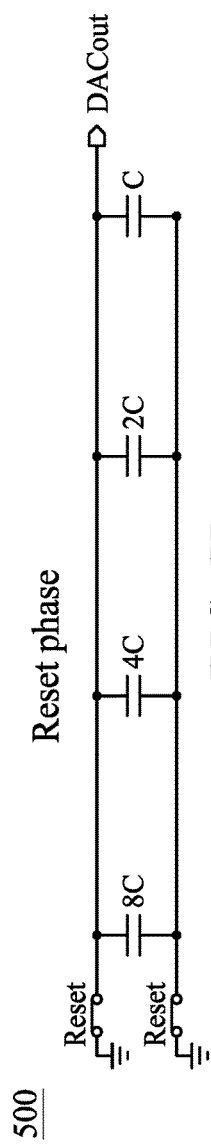
FIG. 5D shows exemplary timing diagrams of pertinent signals in FIG. 5B and FIG. 5C.
Figure 5D:
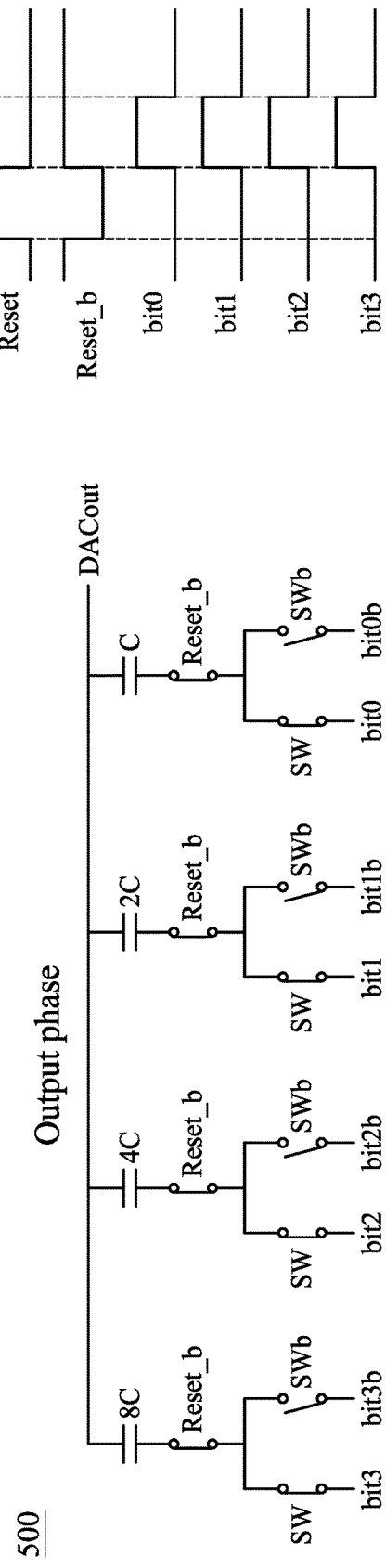

FIG. 5A shows a circuit diagram of a DAC 500 illustrating a node in the first layer of FIG. 1A, FIG. 5B and FIG. 5C show equivalent circuits of the DAC 500 in a reset phase and an output phase respectively, and FIG. 5D shows exemplary timing diagrams of pertinent signals in FIG. 5B and FIG. 5C. In the embodiment, the DAC 500 may include a capacitor array composed of a plurality of capacitors (e.g., C, 2C, 4C and 8C). Top plates of the capacitors are connected together as an output DACout of the DAC 500. Bottom plates of the capacitors are switchably coupled to receive digital outputs or inverted digital outputs of a preceding layer. Specifically, bit0-bit3 represent digital outputs generated by the SAR logic 24 of the preceding layer (e.g., the input layer in FIG. 1A), and bit0$b$-bit3$b$ represent inverted digital outputs of inverted polarity with respect to the digital outputs bit0-bit3, respectively. It is noted that, for example, the digital outputs bit0 and the bit0$b$ are electrically coupled to the corresponding capacitor via switches SW and SWb respectively (wherein SW works opposite SWb), which may be controlled by weights that are pre-trained and pre-stored. The output DACout of the DAC is then forwarded to a comparator (e.g., at the node in the output layer), according to which a voice or a noise may be recognized.

Although specific embodiments have been illustrated and described, it will be appreciated by those skilled in the art that various modifications may be made without departing from the scope of the present invention, which is intended to be limited solely by the appended claims.

What is claimed is:

1. A recognition system, comprising:
   a plurality of static random-access memory (SRAM) cells arranged in columns, SRAM cells of each column respectively receiving corresponding input signals and generating corresponding output signals that are then connected together to result in a sub-signal, and sub-signals of all the columns being subsequently connected together to result in an accumulated signal;
   a quantizer that receives the accumulated signal and generates a digital output, the quantizer including at least one capacitor array;
   wherein the at least one capacitor array is shared with the plurality of SRAM cells; and
   a neural network that includes:
      an input layer composed of nodes coupled to receive the input signals;
      a first layer composed of nodes coupled to receive outputs of the input layer; and
      an output layer coupled to receive outputs of the first layer to accordingly recognize the input signals;
      wherein the plurality of SRAM cells construct the nodes of the input layer;
   wherein each node of the first layer comprises:
      a DAC including a plurality of capacitors arranged in array;
      wherein top plates of the plurality of capacitors are connected as an output of the DAC; and bottom plates of the plurality of capacitors are switchably coupled to receive digital outputs or inverted digital outputs of the input layer.

2. The recognition system of claim 1, wherein the quantizer comprises a successive-approximation-register (SAR) analog-to-digital converter (ADC).

3. The recognition system of claim 2, wherein SAR ADC comprises:
   a first digital-to-analog converter (DAC) composed one of the at least one capacitor array;
   a second DAC composed another of the at least one capacitor array;
   a comparator that receives an output of the first DAC and an output of the second DAC, the comparator receiving the accumulated signal; and
   a SAR logic that receives a comparison output of the comparator and accordingly generates the digital output.

4. A recognition system, comprising:
   a plurality of static random-access memory (SRAM) cells arranged in columns, SRAM cells of each column respectively receiving corresponding input signals and generating corresponding output signals that are then connected together to result in a sub-signal, and sub-signals of all the columns being subsequently connected together to result in an accumulated signal; and
   a quantizer that receives the accumulated signal and generates a digital output, the quantizer including at least one capacitor array;
   wherein the at least one capacitor array is shared with the plurality of SRAM cells;
   wherein each of the plurality of SRAM cells comprises:
      a first inverter connected between ground and a power;
      a second inverter connected between the ground and the power, the first inverter and the second inverter being cross-coupled;
      a first access transistor that accesses an output of the first inverter under control of a word line, the output of the first inverter being then transferred via a first bit line;

a second access transistor that accesses an output of the second inverter under control of the word line, the output of the second inverter being then transferred via a second bit line;

a first passage transistor that passes a common-mode voltage, controlled by the output of the first inverter;

a second passage transistor that passes an input signal, controlled by the output of the second inverter; and a capacitor switchably coupled to receive the common-mode voltage and the input signal through the first passage transistor and the second passage transistor respectively;

wherein capacitors of the plurality of SRAM cells of different columns have binary-weighted values respectively.

5. The recognition system of claim 4, wherein the SRAM cell further comprises:

a switch, via which the capacitor is switchably connected to outputs of the first passage transistor and the second passage transistor, the switch being controlled by a sample clock signal.

6. The recognition system of claim 5, wherein the switch is closed in a sampling phase, during which a bottom plate of the capacitor performs sampling to result in a sampled voltage, while a top plate of the capacitor is coupled to the common-mode voltage; the switch is open in a quantization phase, during which the bottom plate of the capacitor is switchably coupled to a reference voltage via an inverted switch controlled by an inverted sample clock signal of inverted polarity with respect to the sample clock signal, while the sampled voltage is squeezed to the top plate of the capacitor.

7. The recognition system of claim 4, wherein the SRAM cell further comprises:

a first switch transistor connected in series with the first passage transistor; and a second switch transistor connected in series with the second passage transistor;

wherein the first passage transistor indirectly receives the common-mode voltage via the first switch transistor, which is controlled by a sample clock signal; and the second passage transistor indirectly receives the input signal via the second switch transistor, which is controlled by the sample clock signal.

8. The recognition system of claim 7, wherein the first switch transistor and the second switch transistor are closed in a sampling phase, during which a bottom plate of the capacitor performs sampling to result in a sampled voltage, while a top plate of the capacitor is coupled to the common-mode voltage; the first switch transistor and the second switch transistor are open in a quantization phase, during which the bottom plate of the capacitor is switchably coupled to a reference voltage via an inverted switch controlled by an inverted sample clock signal of inverted polarity with respect to the sample clock signal, while the sampled voltage is squeezed to the top plate of the capacitor.

* * * * *